(12) United States Patent
Geiger et al.

(10) Patent No.: US 10,908,208 B2
(45) Date of Patent: Feb. 2, 2021

(54) APPARATUS FOR TESTING AN OPTOELECTRONIC DEVICE AND METHOD OF OPERATING THE SAME

(71) Applicant: AMS SENSORS SINGAPORE PTE, LTD., Singapore (SG)

(72) Inventors: Jens Geiger, Thalwil (CH); Yeoh Ging Sheng, Singapore (SG); Kevin Hauser, Mühlehorn (CH)

(73) Assignee: ams Sensors Singapore. Pte. Ltd., Singapore (SG)

( * ) Notice: Subject to any disclaimer, the term of this patent is extended or adjusted under 35 U.S.C. 154(b) by 20 days.

(21) Appl. No.: 16/472,141

(22) PCT Filed: Jan. 9, 2018

(86) PCT No.: PCT/SG2018/050010
§ 371 (c)(1),
(2) Date: Jun. 20, 2019

(87) PCT Pub. No.: WO2018/132064
PCT Pub. Date: Jul. 19, 2018

(65) Prior Publication Data
US 2019/0324081 A1 Oct. 24, 2019

Related U.S. Application Data

(60) Provisional application No. 62/445,842, filed on Jan. 13, 2017.

(51) Int. Cl.
*G01R 31/28* (2006.01)
*G01R 1/04* (2006.01)

(52) U.S. Cl.
CPC ....... *G01R 31/2875* (2013.01); *G01R 1/0458* (2013.01); *G01R 1/0466* (2013.01); *G01R 31/2856* (2013.01); *G01R 31/2863* (2013.01)

(58) Field of Classification Search
CPC .... G01R 31/00; G01R 31/001; G01R 31/002; G01R 31/26; G01R 31/28; G01R 31/2851;
(Continued)

(56) References Cited

U.S. PATENT DOCUMENTS 7,480,043 B2 * 1/2009 Chiou ................ G01R 31/2635
356/300
2004/0091005 A1 * 5/2004 Hofmeister ............. H01S 5/042
372/34

(Continued)

FOREIGN PATENT DOCUMENTS

| CN | 101187689 | 5/2008 |
|---|---|---|
| JP | 2011-237350 | 11/2011 |
| KR | 2013-0088371 | 8/2013 |

OTHER PUBLICATIONS

ISA/SG, International Search report for PCT/SG2018/050010 (dated Mar. 15, 2018).

*Primary Examiner* — Hoai-An D. Nguyen
(74) *Attorney, Agent, or Firm* — Michael Best and Friedrich LLP

(57) ABSTRACT

Testing apparatus operable to collect optical performance data of optoelectronic devices at different temperatures includes thermal-adjustment devices in thermal and mechanical contact with the optoelectronic devices via optoelectronic device stages. The thermal-adjustment devices can direct thermal energy to the optoelectronic devices under test without heating test targets in close proximity. Consequently, in some instances, spurious results can be avoided and rapid measurement of the optoelectronic devices different temperatures can be achieved.

16 Claims, 5 Drawing Sheets

(58) Field of Classification Search
CPC ............ G01R 31/2855; G01R 31/2856; G01R 31/286; G01R 31/2863; G01R 31/2872; G01R 31/2874; G01R 31/2875; G01R 1/00; G01R 1/02; G01R 1/04; G01R 1/0408; G01R 1/0433; G01R 1/0441; G01R 1/0458; G01R 1/0466
USPC ......... 324/500, 537, 750.01, 750.03, 750.06; 702/127, 182, 183, 184, 185
See application file for complete search history.

(56) References Cited

U.S. PATENT DOCUMENTS

| | | | | |
|---|---|---|---|---|
| 2004/0264009 | A1* | 12/2004 | Hwang | G01J 5/061 359/820 |
| 2005/0259706 | A1* | 11/2005 | Zhang | H01S 5/02248 372/43.01 |
| 2015/0204942 | A1 | 7/2015 | Scocchetti | |
| 2016/0005906 | A1* | 1/2016 | Tung | H01L 31/18 136/246 |
| 2017/0047539 | A1* | 2/2017 | Pentlehner | H01L 51/529 |
| 2018/0188315 | A1* | 7/2018 | Dobrinsky | H01L 33/00 |
| 2019/0293622 | A1* | 9/2019 | Fuchs | G01N 33/2894 |

* cited by examiner

APPARATUS FOR TESTING AN OPTOELECTRONIC DEVICE AND METHOD OF OPERATING THE SAME

BACKGROUND

The optical performance of an optoelectronic device sometimes is measured at a number of different temperatures in order to evaluate performance of the device under different operating temperatures, and to evaluate whether the optoelectronic device is stable upon repeated exposure to non-ambient temperatures (i.e., thermal cycling). These tests can include directing the optoelectronic device to capture data of a test target (e.g., a grey card). A testing apparatus may include both the optoelectronic device and the test target. In some instances, the entire apparatus is subjected to temperature changes in order to collect the test data from the optoelectronic device at the different temperatures. For example, the optoelectronic device may be heated via convection by a heating element in close proximity to the optoelectronic device. This can result, however, in the entire apparatus being heated due inefficiencies in the method of heat transfer.

Such a testing apparatus may have a number of problems. For example, as the temperature of the entire testing apparatus is altered, and the apparatus heat capacity is substantial, significant time may be required to reach a desired testing temperature. Further, sometimes the optoelectronic device is tested at elevated temperatures (e.g., 70° C.). As the entire testing apparatus must be heated to an elevated temperature, the target also is heated to an elevated temperature. This can cause a number of issues. For example, as a single target may be used to evaluate multiple optoelectronic modules (e.g., 10s, 100s, or even 1000s), the target may exhibit dimensional changes with repeated testing such that the captured test data is inaccurate. Further, the test target may experience dimensional changes during testing (i.e., at an elevated temperature). Further, the test target may change chemically (e.g., the surface may oxidize), thereby generating spurious results.

SUMMARY

This disclosure describes apparatus for testing optoelectronic devices at multiple different temperatures that, in some cases, overcome the aforementioned challenges. The disclosure also describes methods for operating the apparatus. The apparatus can facilitate rapid optical performance measurements at multiple different temperatures. Moreover, the test target can exhibit reduced degradation, thereby reducing or minimizing the collection of spurious measurement data.

In a first aspect, an apparatus for testing an optoelectronic device at multiple different temperatures includes an optoelectronic device stage, and a cavity disposed within the optoelectronic device stage. The cavity can be configured to accommodate the optoelectronic device such that the optoelectronic device is inset within the cavity. The apparatus further includes electrical contacts. The electrical contacts can be positioned at least partially within the optoelectronic device stage and can be operable to contact the optoelectronic device electrically. The electrical contacts can be operable to transmit testing commands and testing data between the optoelectronic device and a testing controller. The apparatus further includes a temperature sensing device. The temperature sensing device can be positioned within the stage proximal to the cavity and the optoelectronic device. The temperature sensing device can be operable to transmit temperature sensing data to a thermal controller. The apparatus further includes at least one actuatable mechanical connector fixedly connected to the optoelectronic device stage and a base. The actuatable mechanical connector(s) can be operable to bring the base and the optoelectronic device stage in thermal and mechanical communication. The apparatus further includes a thermal-adjustment device mounted proximal to the base and can be in thermal communication with the base. The thermal-adjustment device can be operable to exchange thermal energy with the base according to temperature adjustment data transmitted from the thermal controller. The apparatus further includes a target stage mounted proximal to the optoelectronic device stage. The target stage can be operable to mechanically contact the optoelectronic device. The apparatus further includes a target mounted within the target stage and aligned with the optoelectronic device.

In some implementations, the apparatus for testing an optoelectronic device at different temperatures includes an optoelectronic device stage in thermal communication with the optoelectronic device.

In some implementations, the thermal-adjustment device is a thermoelectric device.

In some implementations, the thermal-adjustment device is a thermal heating element.

In some implementations, the temperature-sensing device is a thermocouple.

In some implementations, the temperature-sensing device is a thermistor.

In some instances, the apparatus for testing an optoelectronic device at different temperatures includes a fluid-filled thermal adjustment device mounted to a thermal adjustment device, the fluid-filled thermal adjustment device being in thermal communication with the thermal adjustment device.

In some cases, the apparatus for testing an optoelectronic device at different temperatures includes a heat sink mounted to a thermal adjustment device, the heat sink being in thermal communication with the thermal adjustment device.

In some implementations, the heat sink is composed at least partially of aluminum.

In some instances, the heat sink is composed at least partially of copper.

In some implementations, the actuatable mechanical connector is a spring.

In some implementations, the electrical contacts are spring-loaded pins.

In some implementations, the a cover glass is mounted within the target stage and is aligned with the optoelectronic device.

In some implementations, the apparatus for testing an optoelectronic device at different temperatures includes a target stage and an optoelectronic device stage mounted forming a gas-tight seal around the optoelectronic device and a target.

In some implementations, the apparatus for testing an optoelectronic device at different temperatures includes a channel operable to conduct gas between the cavity and an area external to the cavity.

Other aspects, features and advantages will be readily apparent from the following detailed description, the accompanying drawings, and the claims.

DETAILED DESCRIPTION

Figure 1:
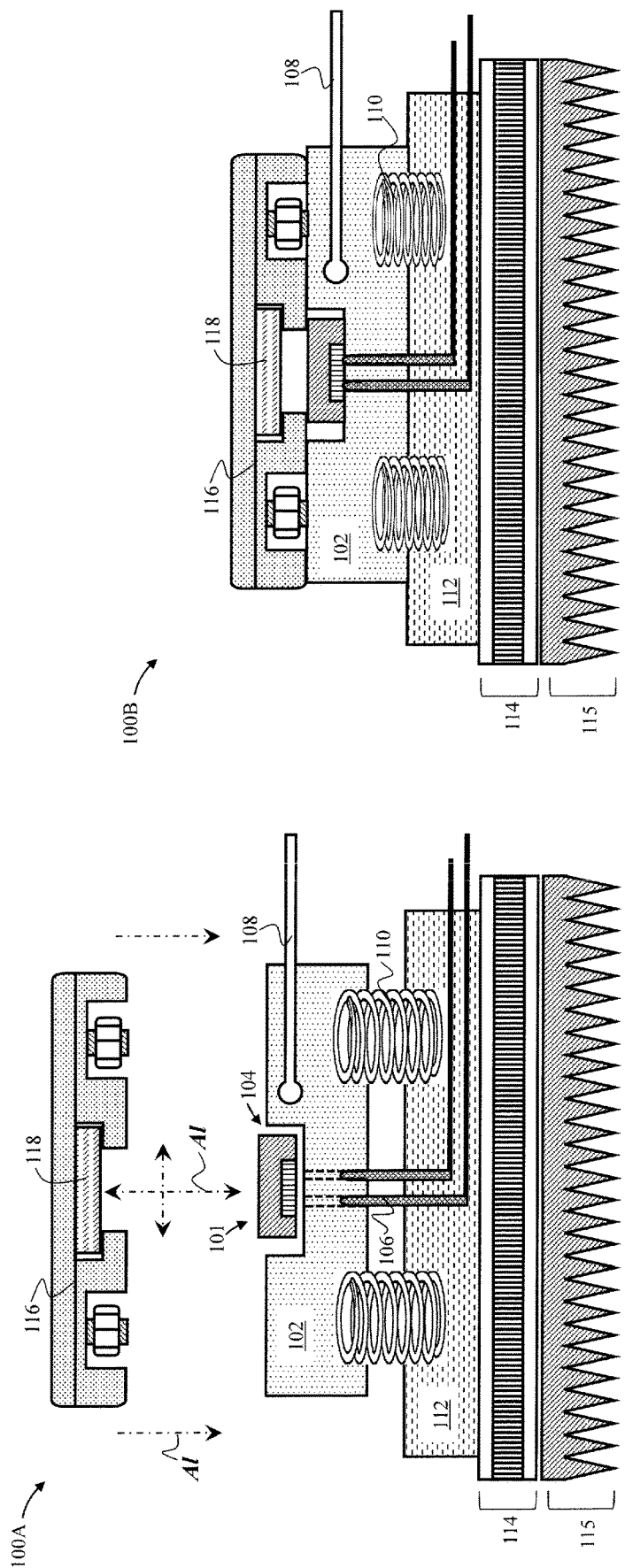
FIG. 1A depicts an example of an apparatus, in an open position, for testing an optoelectronic device at different temperatures.
FIG. 1B depicts the apparatus depicted in FIG. 1A in a closed position.

An example apparatus 100 for testing an optoelectronic device at multiple different temperatures is depicted in FIG. 1A in an open position. The apparatus 100 includes an optoelectronic device 101. The optoelectronic device 101 includes an optoelectronic device stage 102 and a cavity 104 disposed within the optoelectronic device stage 102. The cavity 104 is configured to accommodate the optoelectronic device 101 such that the optoelectronic device 101 is inset within the cavity 104.

The apparatus 100 further includes multiple electrical contacts 106. The electrical contacts 106 can be positioned at least partially within the optoelectronic device stage 102 and are operable to contact the optoelectronic device 101 electrically. The electrical contacts 106 are operable to transmit testing commands and testing data between the optoelectronic device and a testing controller. The electrical contacts 106 can be spring-loaded pins (pogo-pins), for example, or other adjustable electrical contacts.

The apparatus 100 further includes a temperature sensing device 108. The temperature sensing device 108 can be positioned within the optoelectronic device stage 102 proximal to the cavity 104 and the optoelectronic device 101. The temperature sensing device 108 is operable to transmit temperature sensing data to a thermal controller such as a proportionalintegralderivative (PID) controller. The temperature sensing device 108 can be a thermocouple or a thermistor, for example.

The apparatus 100 further includes at least one actuatable mechanical connector 110. The at least one actuatable mechanical connector 110 is fixedly connected to the optoelectronic device stage 102 and a base 112. The at least one actuatable mechanical connector 110 is operable to bring the base 112 and the optoelectronic device stage 102 in thermal and mechanical communication. In some instances, the at least one actuatable mechanical connector 110 is a spring.

The apparatus 100 further includes a thermal-adjustment device 114 mounted proximal to the base 112 and can be in thermal communication with the base 112. The thermal-adjustment device 114 is operable to exchange thermal energy with the base according to temperature adjustment data transmitted from the thermal controller. The thermal-adjustment device 114 can be a thermoelectric device or a thermal heating element, for example.

The apparatus 100 further includes a heat sink 115 mounted to the thermal-adjustment device 114. The heat sink 115 is in thermal communication with the thermal adjustment device 114. The heat sink 115 can be at least partially composed of copper or aluminum, for example. In some instances, the heat sink 115 is at least partially composed of a high heat capacity material and/or a material with high thermal conductivity.

The apparatus 100 further includes a target stage 116 mounted proximal to the optoelectronic device stage 102. The target stage 116 is operable to mechanically contact the optoelectronic device 101.

The apparatus 100 further includes a target 118 mounted within the target stage 116 and aligned with the optoelectronic device 101 as indicated by alignment arrows A1 as illustrated in FIG. 1A. The target can be a grey card, for example.

FIG. 1B depicts the apparatus 100 for testing an optoelectronic device at different temperatures in a closed position. The apparatus 100 is illustrated with principal components in thermal and mechanical communication.

Figure 2:
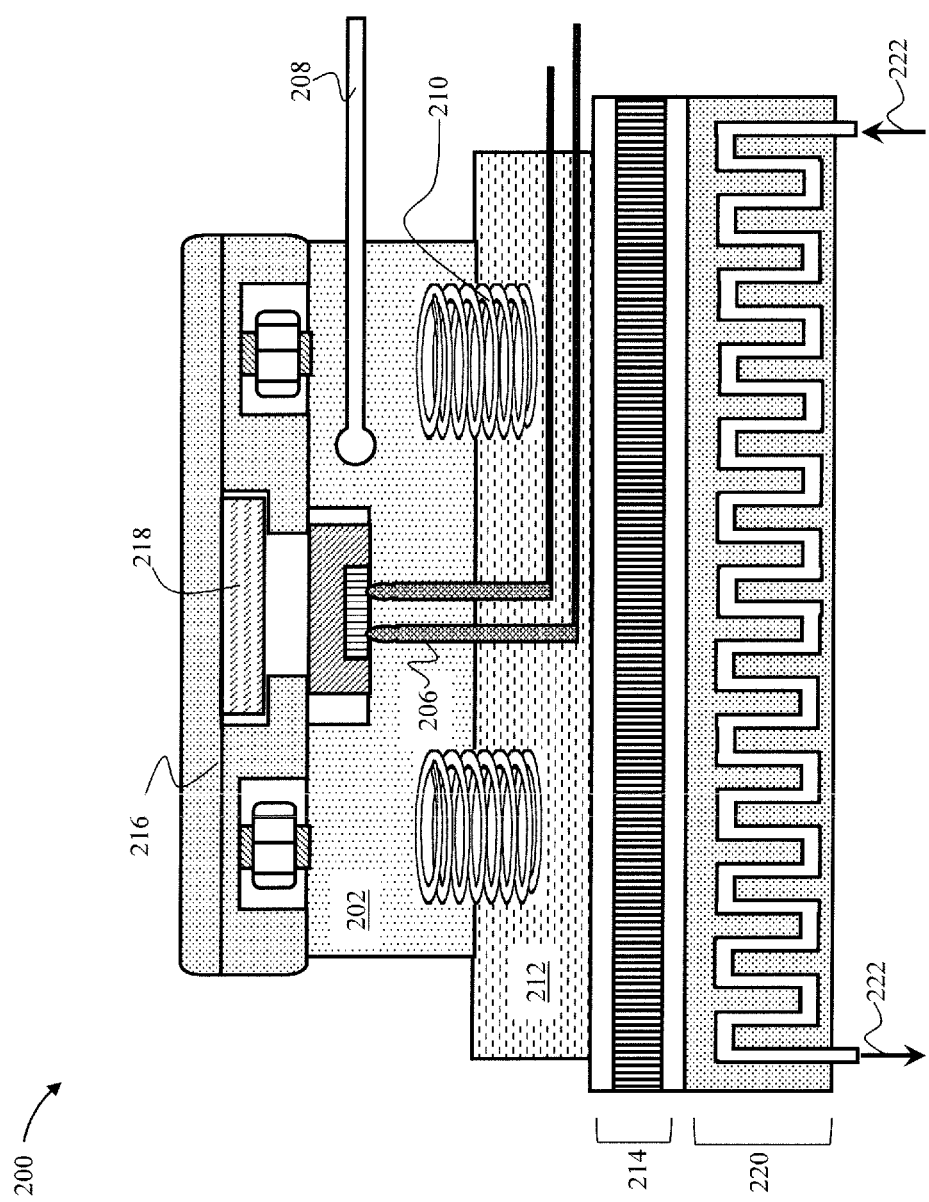
FIG. 2 depicts another example of an apparatus for testing an optoelectronic device at different temperatures.

FIG. 2 depicts another example of an apparatus for testing an optoelectronic device at multiple different temperatures. The apparatus 200 includes an optoelectronic device 201. The optoelectronic device 201 includes an optoelectronic device stage 202 and a cavity 204 disposed within the optoelectronic device stage 202. The cavity 204 is configured to accommodate the optoelectronic device 201 such that the optoelectronic device 201 is inset within the cavity 204.

The apparatus 200 further includes electrical contacts 206. The electrical contacts 206 are positioned at least partially within the optoelectronic device stage 202 and are operable to contact the optoelectronic device 201 electrically. The electrical contacts 206 are operable to transmit testing commands and testing data between the optoelectronic device and a testing controller. The electrical contacts 206 can be spring-loaded pins (pogo-pins), for example, or other adjustable electrical contacts.

The apparatus 200 further includes a temperature sensing device 208. The temperature sensing device 108 is positioned within the optoelectronic device stage 202 proximal to the cavity 204 and the optoelectronic device 201. The temperature sensing device 208 is operable to transmit temperature sensing data to a thermal controller such as a PID controller. The temperature sensing device 208 can be a thermocouple or a thermistor, for example.

The apparatus 200 further includes at least one actuatable mechanical connector 210. The at least one actuatable mechanical connector 210 is fixedly connected to the optoelectronic device stage 202 and a base 212. The at least one actuatable mechanical connector 210 is operable to bring the base 212 and the optoelectronic device stage 202 in thermal and mechanical communication. In some instances, the at least one actuatable mechanical connector 210 is a spring.

The apparatus 200 further includes a thermal-adjustment device 214 mounted proximal to the base 212 and is in thermal communication with the base 212. The thermal-adjustment device 214 is operable to exchange thermal energy with the base according to temperature adjustment data transmitted from the thermal controller. The thermal-adjustment device 214 can be a thermoelectric device or a thermal heating element, for example.

The apparatus 200 further includes a fluid-filled thermal adjustment device 220 with a fluid 222. The fluid-filled adjustment device 220 is mounted in thermal and mechanical communication with the thermal adjustment device 214. The fluid 222 can be water, ethelyne glycol, oil, air or any other suitable fluid operable to conduct heat from the vicinity of the thermal adjustment device 214 and further is operable to affect rapid temperature changes on the optoelectronic device 201.

The apparatus 200 further includes a target stage 216 mounted proximal to the optoelectronic device stage 202. The target stage 216 is operable to mechanically contact the optoelectronic device 201.

The apparatus 200 further includes a target 218 mounted within the target stage 216 and aligned with the optoelectronic device 201. The target can be a grey card, for example.

Figure 3:
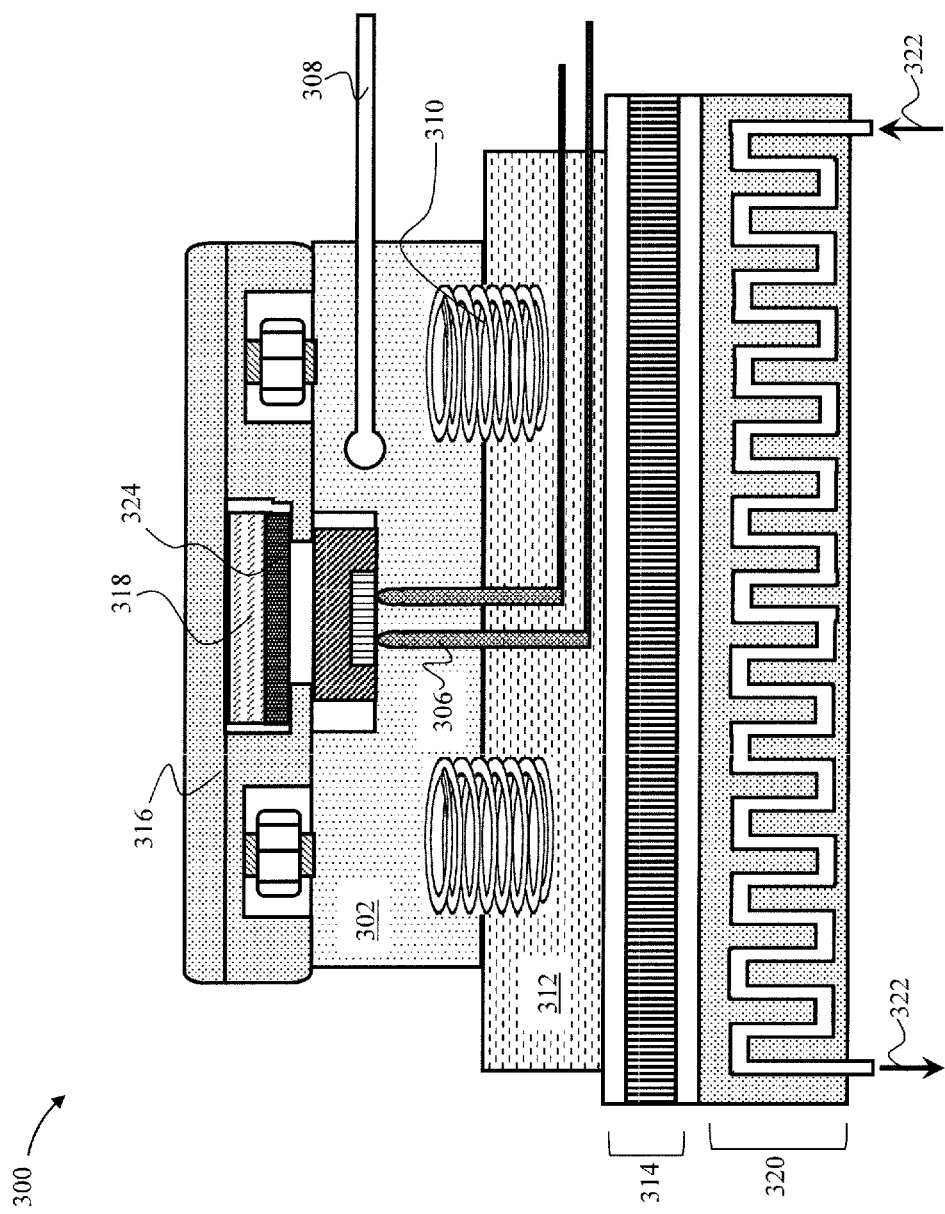
FIG. 3 depicts still another example of an apparatus for testing an optoelectronic device at different temperatures.

FIG. 3 depicts still another example apparatus for testing an optoelectronic device at different temperatures. The apparatus 300 includes an optoelectronic device 301. The optoelectronic device 301 includes an optoelectronic device stage 302 and a cavity 304 disposed within the optoelectronic device stage 302. The cavity 304 is configured to accommodate the optoelectronic device 301 such that the optoelectronic device 301 is inset within the cavity 304. The apparatus 300 further includes a cover glass 324 aligned with the optoelectronic device 301. The cover glass 324 can simulate a cover glass with which the optoelectronic device 301 is likely to be aligned and mounted in operation (i.e., as implemented in an end-user's device).

The apparatus 300 further includes electrical contacts 306. The electrical contacts 306 are positioned at least partially within the optoelectronic device stage 302 and are operable to contact the optoelectronic device 301 electrically. The electrical contacts 306 are operable to transmit testing commands and testing data between the optoelectronic device and a testing controller. The electrical contacts 306 can be spring-loaded pins (pogo-pins), for example, or other adjustable electrical contacts.

The apparatus 300 further includes a temperature sensing device 308. The temperature sensing device 308 is positioned within the optoelectronic device stage 302 proximal to the cavity 304 and the optoelectronic device 301. The temperature sensing device 308 is operable to transmit temperature sensing data to a thermal controller such as a PID controller. The temperature sensing device 308 can be a thermocouple or a thermistor, for example.

The apparatus 300 further includes at least one actuatable mechanical connector 310. The at least one actuatable mechanical connector 310 is fixedly connected to the optoelectronic device stage 302 and a base 312. The at least one actuatable mechanical connector 310 is operable to bring the base 312 and the optoelectronic device stage 302 in thermal and mechanical communication. In some instances, the at least one actuatable mechanical connector 310 is a spring.

The apparatus 300 further includes a thermal-adjustment device 314 mounted proximal to the base 312 and is in thermal communication with the base 312. The thermal-adjustment device 314 is operable to exchange thermal energy with the base according to temperature adjustment data transmitted from the thermal controller. The thermal-adjustment device 314 can be a thermoelectric device or a thermal heating element, for example.

The apparatus 300 further includes a fluid-filled thermal adjustment device 320 with a fluid 322. The fluid-filled adjustment device 320 is mounted in thermal and mechanical communication with the thermal adjustment device 314. The fluid 322 can be water, ethylene glycol, oil, air or any other suitable fluid operable to conduct heat from the vicinity of the thermal adjustment device 314 and further is operable to affect rapid temperature changes on the optoelectronic device 301.

The apparatus 300 further includes a target stage 316 mounted proximal to the optoelectronic device stage 302. The target stage 316 is operable to mechanically contact the optoelectronic device 301.

The apparatus 300 further includes a target 318 mounted within the target stage 316 and aligned with the optoelectronic device 301. The target can be a grey card, for example.

Figure 4:
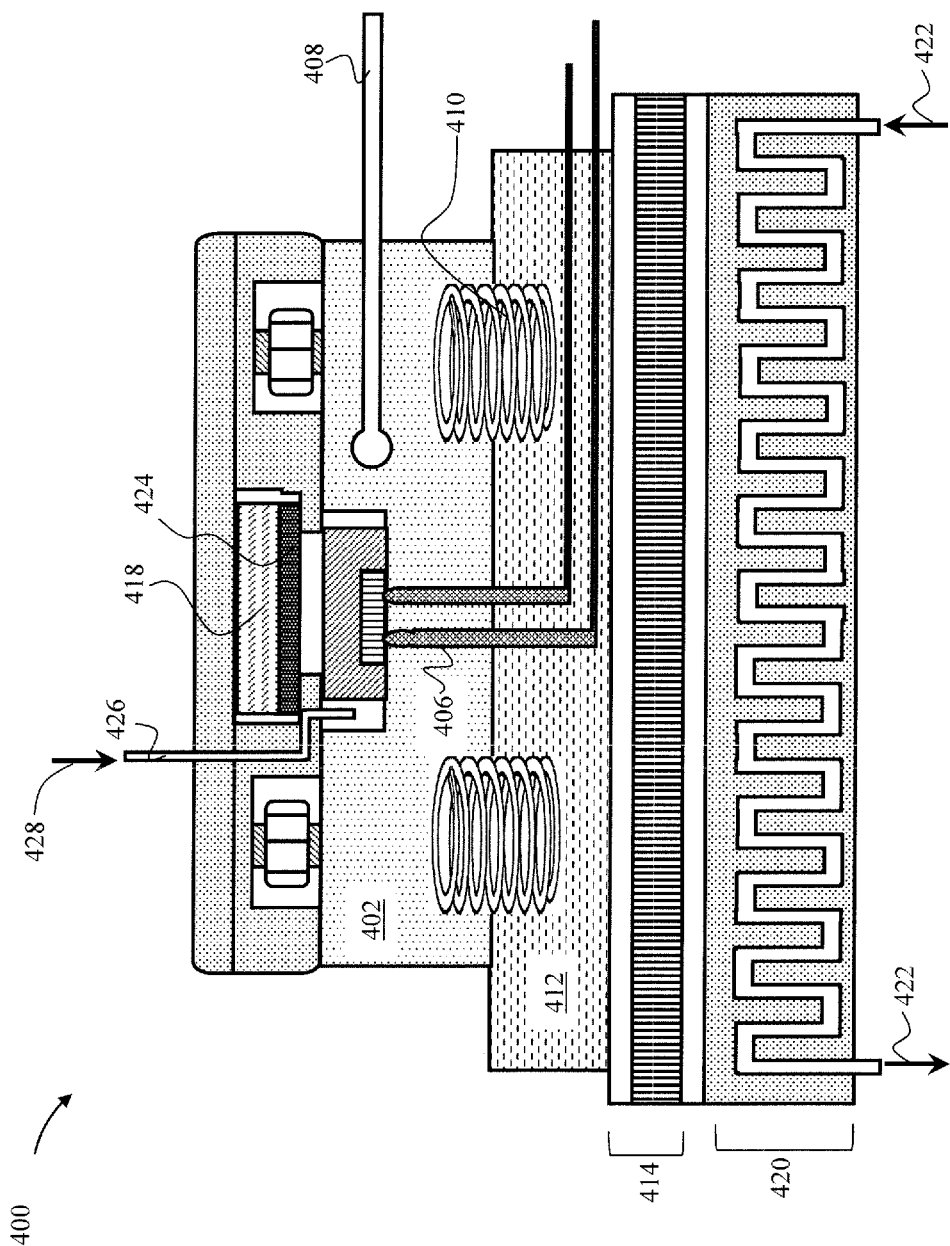
FIG. 4 depicts yet still another example of an apparatus for testing an optoelectronic device at different temperatures.

FIG. 4 depicts yet still another example apparatus for testing an optoelectronic device at different temperatures. The apparatus 400 includes an optoelectronic device 401. The optoelectronic device 401 includes an optoelectronic device stage 402 and a cavity 404 disposed within the optoelectronic device stage 402. The cavity 404 is configured to accommodate the optoelectronic device 401 such that the optoelectronic device 401 is inset within the cavity 404. The apparatus 400 further includes a cover glass 424 aligned with the optoelectronic device 401. The cover glass 424 can simulate a cover glass with which the optoelectronic device 401 is likely to be aligned and mounted in operation (i.e., as implemented in an end-user's device).

The apparatus 400 further includes electrical contacts 406. The electrical contacts 406 are positioned at least partially within the optoelectronic device stage 402 and are operable to contact the optoelectronic device 401 electrically. The electrical contacts 406 are operable to transmit testing commands and testing data between the optoelectronic device and a testing controller. The electrical contacts 406 can be spring-loaded pins (pogo-pins), for example, or other adjustable electrical contacts.

The apparatus 400 further includes a temperature sensing device 408. The temperature sensing device 408 is positioned within the optoelectronic device stage 402 proximal to the cavity 404 and the optoelectronic device 401. The temperature sensing device 408 is operable to transmit temperature sensing data to a thermal controller such as a PID controller. The temperature sensing device 408 can be a thermocouple or a thermistor, for example.

The apparatus 400 further includes at least one actuatable mechanical connector 410. The at least one actuatable mechanical connector 410 is fixedly connected to the optoelectronic device stage 402 and a base 412. The at least one actuatable mechanical connector 410 is operable to bring the base 412 and the optoelectronic device stage 402 in thermal and mechanical communication. In some instances, the at least one actuatable mechanical connector 410 can be a spring.

The apparatus 400 further includes a thermal-adjustment device 414 mounted proximal to the base 412 and is in thermal communication with the base 412. The thermal-adjustment device 414 is operable to exchange thermal energy with the base according to temperature adjustment data transmitted from the thermal controller. The thermal-adjustment device 414 is a thermoelectric device or a thermal heating element, for example.

The apparatus 400 further includes a fluid-filled thermal adjustment device 420 with a fluid 422. The fluid-filled adjustment device 420 is mounted in thermal and mechanical communication with the thermal adjustment device 414. The fluid 422 can be water, ethylene glycol, oil, air or any other suitable fluid operable to conduct heat from the vicinity of the thermal adjustment device 414 and further operable to affect rapid temperature changes on the optoelectronic device 401.

The apparatus 400 further includes a target stage 416 mounted proximal to the optoelectronic device stage 402. The target stage 416 is operable to mechanically contact the optoelectronic device 401.

The apparatus 400 further includes a target 418 mounted within the target stage 416 and aligned with the optoelectronic device 401. The target can be a grey card, for example. In some instances, the target stage 416 and the optoelectronic device stage 402 are mounted forming a gas-tight seal around the optoelectronic device 401 and the target 418.

The apparatus 400 further includes an inert gas channel 426. The inert gas channel 426 is operable to conduct inert gas 428 between the cavity 404 and an area external to the cavity 404. In some instances, inert gas 428 is argon or a reducing gas such as hydrogen or a mixture of gasses including hydrogen. In some instances, the inert gas channel 426 is operable to evacuate the cavity 404. In some instances, the humidity of the cavity 404 is altered via the inert gas channel 426.

Figure 5A:
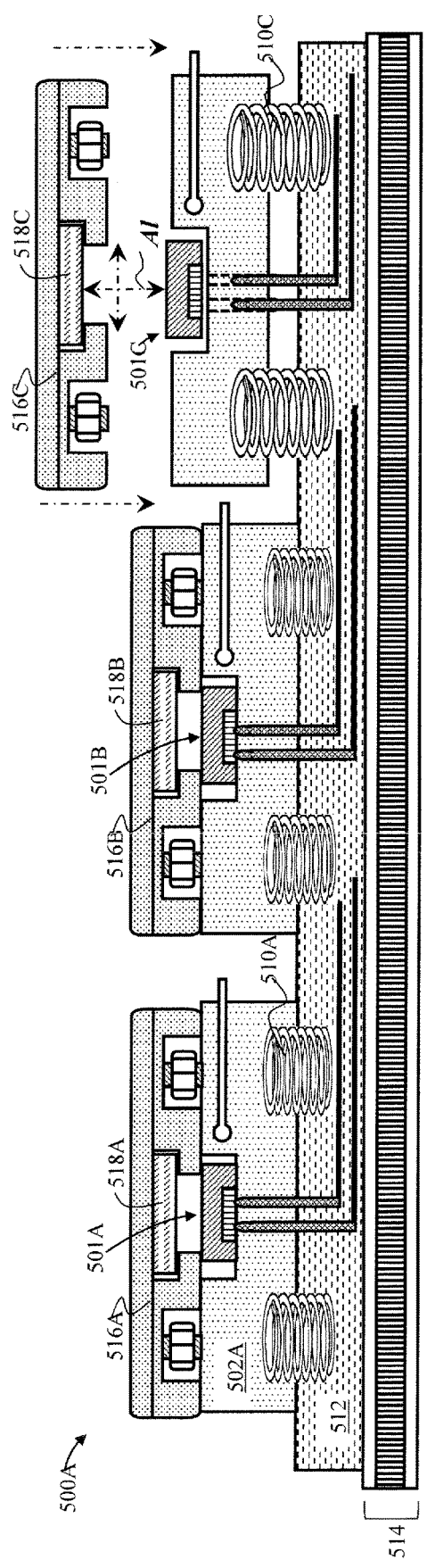
FIG. 5A depicts an example of an apparatus for testing multiple optoelectronic devices at different temperatures.

FIG. 5A depicts an example apparatus for testing a plurality of optoelectronic devices at different temperatures. The apparatus 500A includes optoelectronic devices 501. The plurality of optoelectronic devices 501 include optoelectronic device stages 502A, 502B, 502C, and cavities 504A, 504B, 504C correspondingly disposed within each of the optoelectronic device stages 502A, 502B, 502C. The cavities 504A, 504B, 504C are configured to correspondingly accommodate the optoelectronic devices 501A, 501B, 501C such that the optoelectronic devices 501A, 501B, 501C are correspondingly inset within each of the cavities 504A, 504B, 504C.

The apparatus 500A further includes electrical contacts 506. The electrical contacts 506 are positioned at least partially within each of the optoelectronic device stages 502A, 502B, 502C and are operable to correspondingly contact each of the optoelectronic devices 501A, 501B, 501C electrically. The electrical contacts 506 are operable to correspondingly transmit testing commands and testing data between each of the optoelectronic devices 501A, 501B, 501C and a testing controller. The electrical contacts 506 can be spring-loaded pins (pogo-pins), for example, or other adjustable electrical contacts.

The apparatus 500A further includes temperature sensing devices 508A, 508B, 508C. Each of the temperature sensing devices 508A, 508B, 508C is positioned within a corresponding optoelectronic device stage 502A, 502B, 502C proximal to a corresponding cavity 504A, 504B, 504C and a corresponding optoelectronic device 501A, 501B, 501C. Each of the temperature sensing devices 508A, 508B, 508C is operable to transmit temperature sensing data to a thermal controller such as a PID controller. Each of the temperature sensing devices 508A, 508B, 508C can be a thermocouple or a thermistor, for example.

The apparatus 500A further includes at least one actuatable mechanical connector 510A, 510B, 510C fixedly connected to a corresponding optoelectronic device stage 502A, 502B, 502C and a base 212. The at least one actuatable mechanical connector 510A, 510B, 510C are operable to bring the base 212 and a corresponding optoelectronic device stage 502A, 502B, 502C in thermal and mechanical communication. In some instances, the at least one actuatable mechanical connectors 510A, 510B, 510C are springs.

The apparatus 500A further includes a thermal-adjustment device 514 mounted proximal to the base 512 and in thermal communication with the base 512. The thermal-adjustment device 514 is operable to exchange thermal energy with the base according to temperature adjustment data transmitted from the thermal controller. The thermal-adjustment device 514 can be a thermoelectric device or a thermal heating element, for example.

The apparatus 500A further includes target stages 516A, 516B, 516C correspondingly mounted proximal to the optoelectronic device stages 502A, 502B, 502C. The target stages 516A, 516B, 516C are operable to correspondingly mechanically contact the optoelectronic devices 501A, 501B, 501C.

The apparatus 500A further includes targets 518A, 518B, 518C correspondingly mounted within the target stages 516A, 516B, 516C and correspondingly aligned with the optoelectronic devices 501A, 501B, 501C. The target can be a grey card, for example.

Figure 5B:
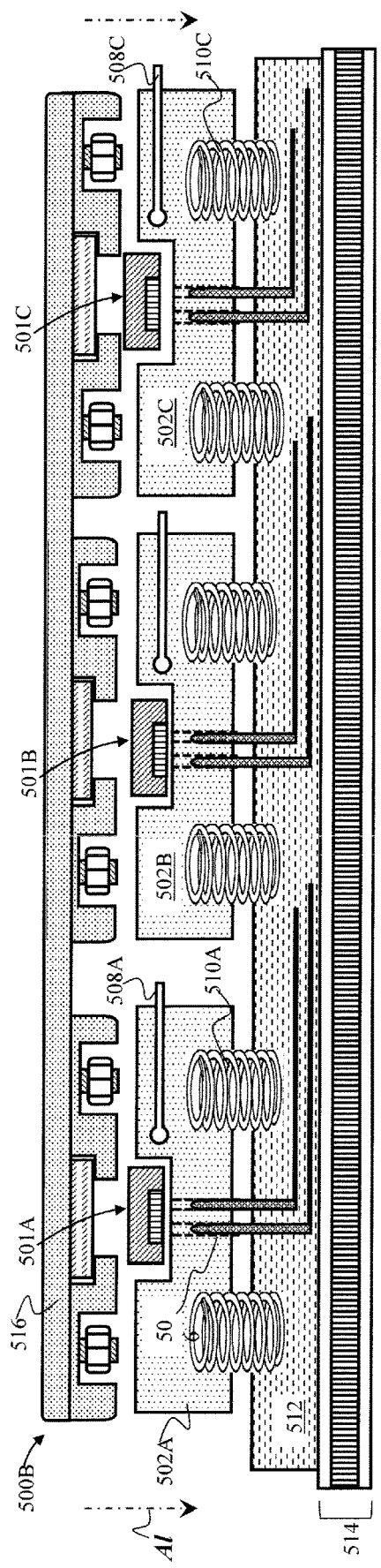
FIG. 5B depicts another example of an apparatus for testing multiple optoelectronic devices at different temperatures.

Another example apparatus for testing optoelectronic devices at different temperatures is depicted in FIG. 5B. The apparatus 500B includes optoelectronic devices 501. The optoelectronic devices 501 include optoelectronic device stages 502A, 502B, 502C, and cavities 504A, 504B, 504C correspondingly disposed within each of the optoelectronic device stages 502A, 502B, 502C. The cavities 504A, 504B, 504C are configured to correspondingly accommodate the optoelectronic devices 501A, 501B, 501C such that the optoelectronic devices 501A, 501B, 501C are correspondingly inset within each of the cavities 504A, 504B, 504C.

The apparatus 500B further includes electrical contacts 506. The plurality of electrical contacts 506 are positioned at least partially within each of the optoelectronic device stages 502A, 502B, 502C and are operable to correspondingly contact each of the optoelectronic devices 501A, 501B, 501C electrically. The electrical contacts 506 are operable to correspondingly transmit testing commands and testing data between each of the optoelectronic devices 501A, 501B, 501C and a testing controller. The electrical contacts 506 can be spring-loaded pins (pogo-pins), for example, or other adjustable electrical contacts.

The apparatus 500B further includes temperature sensing devices 508A, 508B, 508C. Each of the temperature sensing devices 508A, 508B, 508C is positioned within a corresponding optoelectronic device stage 502A, 502B, 502C proximal to a corresponding cavity 504A, 504B, 504C and a corresponding optoelectronic device 501A, 501B, 501C. Each of the temperature sensing devices 508A, 508B, 508C is operable to transmit temperature sensing data to a thermal controller such as a PID controller. Each of the temperature sensing devices 508A, 508B, 508C can be a thermocouple or a thermistor, for example.

The apparatus 500B further includes at least one actuatable mechanical connector 510A, 510B, 510C fixedly connected to a corresponding optoelectronic device stage 502A, 502B, 502C and a base 212. The actuatable mechanical connectors 510A, 510B, 510C are operable to bring the base 212 and a corresponding optoelectronic device stage 502A, 502B, 502C in thermal and mechanical communication. In some instances, the actuatable mechanical connectors 510A, 510B, 510C are springs.

The apparatus 500B further includes a thermal-adjustment device 514 mounted proximal to the base 512 and in thermal communication with the base 512. The thermal-adjustment device 514 are operable to exchange thermal energy with the base according to temperature adjustment data transmitted from the thermal controller. The thermal-adjustment device 514 can be a thermoelectric device or a thermal heating element, for example.

The apparatus 500B further includes a target stage 516 mounted proximal to the plurality of optoelectronic device stages 502A, 502B, 502C. The target stage 516 is operable to mechanically contact the optoelectronic devices 501A, 501B, 501C.

The apparatus 500B further includes targets 518A, 518B, 518C mounted within the target stage 516 and correspondingly aligned with the optoelectronic devices 501A, 501B, 501C. The target can be a grey card, for example.

Other modifications may be made to the foregoing implementations, and features described above in different implementations can be combined in the same implementations. Thus, other implementations are within the scope of the claims.

What is claimed, is:

1. An apparatus for testing an optoelectronic device at a plurality of different temperatures, the apparatus comprising:
    an optoelectronic device stage;
    a cavity disposed within the optoelectronic device stage, the cavity being configured to accommodate the optoelectronic device such that the optoelectronic device is inset within the cavity;
    a plurality of electrical contacts positioned at least partially within the optoelectronic device stage and operable to contact the optoelectronic device electrically, wherein the plurality of electrical contacts are operable to transmit testing commands and testing data between the optoelectronic device and a testing controller;
    a temperature sensing device positioned within the stage proximal to the cavity and the optoelectronic device, wherein the temperature sensing device is operable to transmit temperature sensing data to a thermal controller;
    at least one actuatable mechanical connector fixedly connected to the optoelectronic device stage and a base, the at least one actuatable mechanical connector being operable to bring the base and the optoelectronic device stage in thermal and mechanical communication;
    a thermal-adjustment device mounted proximal to the base and in thermal communication with the base, the thermal-adjustment device being operable to exchange thermal energy with the base according to temperature adjustment data transmitted from the thermal controller;
    a target stage mounted proximal to the optoelectronic device stage and operable to mechanically contact the optoelectronic device; and
    a target mounted within the target stage and aligned with the optoelectronic device.

2. The apparatus of claim 1, wherein the optoelectronic device stage is in thermal communication with the optoelectronic device.

3. The apparatus of claim 1, wherein the thermal-adjustment device is a thermoelectric device.

4. The apparatus of claim 1, wherein the thermal-adjustment device is a thermal heating element.

5. The apparatus of claim 1, wherein the temperature-sensing device is a thermocouple.

6. The apparatus of claim 1, wherein the temperature-sensing device is a thermistor.

7. The apparatus of claim 1 further comprising a fluid-filled thermal adjustment device mounted to the thermal adjustment device, the fluid-filled thermal adjustment device being in thermal communication with the thermal adjustment device.

8. The apparatus of claim 1 further comprising a heat sink mounted to the thermal adjustment device, the heat sink being in thermal communication with the thermal adjustment device.

9. The apparatus of claim 8, wherein the heat sink is composed at least partially of aluminum.

10. The apparatus of claim 8, wherein the heat sink is composed at least partially of copper.

11. The apparatus of claim 1, wherein the at least one actuatable mechanical connector includes a spring.

12. The apparatus of claim 1, wherein the plurality of electrical contacts include spring-loaded pins.

13. The apparatus of claim 1, wherein the target stage further includes a cover glass mounted within the target stage and aligned with the optoelectronic device.

14. The apparatus of claim 1, wherein the target stage and the optoelectronic device stage are mounted to form a gas-tight seal around the optoelectronic device and the target.

15. The apparatus of claim 14 further including a channel operable to conduct gas between the cavity and an area external to the cavity.

16. A method for testing an optoelectronic device, the method comprising:
    providing an apparatus for testing the optoelectronic device, the apparatus including an optoelectronic device stage;
    mounting the optoelectronic device into a cavity within the optoelectronic device stage;
    contacting the optoelectronic device electrically with electrical contacts;
    mounting a target into a target stage;
    aligning the target stage to the optoelectronic device;
    mechanically contacting the target stage to the optoelectronic device such that the optoelectronic device is inset within the cavity;
    transmitting temperature sensor data between a temperature sensing device and a thermal controller, the temperature sensing device being mounted within the optoelectronic device stage and proximal to the cavity and the optoelectronic device;
    transmitting data between the thermal controller and a thermal-adjustment device in thermal communication with the optoelectronic device; and
    transmitting testing commands and testing data between the optoelectronic device and a testing controller via the electrical contacts.

* * * * *